United States Patent
Böhm et al.

(10) Patent No.: US 6,487,128 B2
(45) Date of Patent: Nov. 26, 2002

(54) INTEGRATED MEMORY HAVING MEMORY CELLS AND REFERENCE CELLS, AND OPERATING METHOD FOR SUCH A MEMORY

(75) Inventors: Thomas Böhm, Zorneding (DE); Heinz Hönigschmid, East Fishkell, NY (US); Thomas Röhr, Yokohama (JP); Georg Braun, München (DE); Zoltan Manyoki, CDN-Kanata (CA)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/962,411

(22) Filed: Sep. 24, 2001

(65) Prior Publication Data

US 2002/0027816 A1 Mar. 7, 2002

Related U.S. Application Data

(63) Continuation of application No. PCT/DE00/00759, filed on Mar. 10, 2000.

(30) Foreign Application Priority Data

Mar. 23, 1999 (DE) .......................................... 199 13 108

(51) Int. Cl.$^7$ .................................................. G11C 7/00
(52) U.S. Cl. ............................ 365/189.07; 365/189.09; 365/145
(58) Field of Search ............................ 365/145, 189.07, 365/189.09, 129, 189.01, 149

(56) References Cited

U.S. PATENT DOCUMENTS

| 5,694,353 A | * 12/1997 | Koike ........................ 365/145 |
| 5,751,626 A | 5/1998 | Seyyedy |
| 5,828,615 A | * 10/1998 | Mukunoki et al. .......... 365/145 |
| 5,978,250 A | * 11/1999 | Chung et al. ................ 365/145 |

\* cited by examiner

Primary Examiner—Hoai Ho
(74) Attorney, Agent, or Firm—Laurence A. Greenberg; Werner H. Stemer; Ralph E. Locher

(57) ABSTRACT

The memory has identically constructed memory cells and reference cells. An item of reference information is written into the reference cells by uncoupling the reference cells from the read amplifiers via first switching elements, and by electrically connecting the part of the bit lines that is connected to the reference cells via second switching elements to a potential line carrying the reference information.

10 Claims, 5 Drawing Sheets

INTEGRATED MEMORY HAVING MEMORY CELLS AND REFERENCE CELLS, AND OPERATING METHOD FOR SUCH A MEMORY

CROSS-REFERENCE TO RELATED APPLICATION

This application is a continuation of copending International Application PCT/DE00/00759, filed Mar. 10, 2000, which designated the United States.

BACKGROUND OF THE INVENTION

Field of the Invention

The invention lies in the integrated technology field and relates, more specifically, to an integrated memory having memory cells and reference cells, and an operating method for such a memory.

U.S. Pat. Nos. 5,844,832 and 5,572,459 describe ferroelectric memories (FRAM or FeRAM), which have memory cells of the 1-transistor/1-capacitor type. The storage capacitor has a ferroelectric dielectric, whose polarization is set to different values in order to store different logic states. By setting the polarization of the dielectric, the capacitance of the storage capacitor is influenced. Since the aforementioned memory cells, during a read access, can effect only small potential changes on the bit lines connected to them because of their restricted capacity, these memories have differential read amplifiers, such as are also used, for example, in DRAMs (dynamic random access memories). Each read amplifier is connected to a pair of bit lines. During a read access to one of the memory cells, the latter is electrically connected via one of the bit lines to the associated read amplifier, while the other bit line of the pair of bit lines connected to this read amplifier connects a reference cell electrically to the second input of the read amplifier.

The reference cells are constructed in substantially the same way as the normal memory cells of the FRAM, and are used to generate a reference potential on the corresponding second bit line. The read amplifier then amplifies the potential difference which is established between the two bit lines. In order to generate the desired reference potential on the second bit line, it is necessary to store appropriate reference information previously in the reference cell. To this end, both in U.S. Pat. No. 5,572,459 and 5,844,832 the reference cells are modified as compared with the normal memory cells, in that they are connected via additional transistors to potential lines which are used to supply the desired reference information. These additional transistors are connected to a circuit node within the memory cell, the node being located between the respective selection transistor and the storage capacitor of the reference cell.

The aforementioned memory cells modified by means of an additional transistor have the disadvantage that, because of the transistor that is additionally present, they are not constructed fully identically with the normal memory cells. The result of this is that the reference cells are not produced on the same grid as the normal memory cells. This results in a more complicated manufacturing process for the memory.

SUMMARY OF THE INVENTION

It is accordingly an object of the invention to provide an integrated memory with memory cells and reference cells which overcomes the above-mentioned disadvantages of the heretofore-known devices and methods of this general type and which whose memory cells and reference cells can be arranged in a regular grid. In addition, it is an object of the invention to specify an operating method for such a memory.

With the foregoing and other objects in view there is provided, in accordance with the invention, an integrated memory, comprising:

a first pair of bit lines and a plurality of word lines and reference word lines;

memory cells respectively arranged at crossing points of the word lines with a bit line of the first pair of bit lines and each having a selection switching element for connecting the memory cell with a respective bit line and the selection switching element having a control connection connected to a respective word line;

a first differential read amplifier connected to the bit lines of the first pair of bit lines and a second differential read amplifier;

two reference cells respectively arranged at a crossing point of one of the bit lines and a reference word line, having a structure substantially corresponding to a structure of the memory cells, and having a selection switching element for connecting the reference cells via a circuit node to a respective bit line, and the selection switching element having a control connection connected to the respective reference word line;

first switching elements connecting the circuit nodes to the read amplifier;

a first potential line for supplying a first potential to be stored in the reference cells;

second switching elements connecting the circuit nodes to the first potential line;

a second pair of bit lines connected to the second differential read amplifier and, in correspondence with the first pair of bit lines, having memory cells, reference cells, and first and second switching elements;

two third switching elements each connecting a respective one of the bit lines of the first pair of bit lines to a bit line of the second pair of bit lines; and a second potential line connected to the circuit nodes of the bit lines of the second bit line pair via the second switching elements, the second potential line supplying a second potential to be stored in the reference cells of the second pair of bit lines.

In other words, the integrated memory has identically constructed memory cells and reference cells. The second switching elements are used to supply the reference information to the reference cells. Since the second switching elements are not connected to a circuit node within the reference cell but to a circuit node on the associated bit line, the reference cells do not have to be modified as compared with the reference cells. This permits, firstly, the production of the memory cell array having the memory cells and reference cells in a regular grid, whose extent is predefined by the minimum dimensions of the memory cells. Secondly, there results the advantage that writing and reading the reference information into and from the reference cells is carried out in the same way as the writing and reading of data into and from the memory cells. Since the precise behavior of the memory cells during an access also depends on fluctuations in the manufacturing process, the access behavior of the reference cells, which are constructed identically to the memory cells, is influenced in the same way, on account of such influences, as that of the memory cells. This therefore ensures that the reference information provided by the reference cells is matched to the changed access behavior of the normal memory cells, even for different manufacturing conditions of the memory.

In accordance with an added feature of the invention, the reference cells and the first switching elements are arranged at one end of the respective bit line opposite the read amplifier. This results in an arrangement which is advantageous in terms of circuitry, in which relatively few control signals are needed to drive the first switching elements. In order to maintain the grid of the cell array, the first switching elements can likewise be arranged in this grid.

According to another development of the invention, the first switching elements are arranged at the end of the respective bit line facing the read amplifier. This has the advantage that there is often sufficient space available in the read amplifiers, and the switching elements can therefore be arranged without problems, even if the grid of the memory cell array becomes very small because of very small memory cells.

In accordance with an additional feature of the invention, during a read access to a given one of the memory cells of one of the bit lines, the selection switching element of the given memory cell and the selection switching element of the reference cell of the other bit line are turned on and also both first switching elements are turned on and both second switching elements are turned off, and wherein, during a rewriting operation, carried out during the read access, of the information previously read out from the corresponding the memory cell by the read amplifier the selection switching elements of the given memory cell and of the reference cell are turned on and only the first switching element connected to the one bit line and the second switching element connected to the other bit line are turned on.

In accordance with a further feature of the invention, there is provided a control unit connected to the first and second potential lines, for generating the first and second potentials with respectively alternating levels.

With the above and other objects in view there is also provided, in accordance with the invention, an operating method for an integrated memory. The method comprises the following steps:

reading out information from two memory cells and transferring the information via two first bit lines to first inputs of two differential read amplifiers;

reading out reference information from reference cells and transferring the reference information via second bit lines to second inputs of the read amplifiers;

amplifying voltages present at the inputs of the read amplifiers with the read amplifiers;

disconnecting the reference cells from the read amplifiers;

connecting the reference cells to potential lines; and transferring potentials from the potential lines via the second bit lines to the reference cells.

In accordance with yet an added feature of the invention, the potentials of the potential lines are different, and the method comprises connecting the second bit lines to each other for setting a reference potential.

In accordance with a concomitant feature of the invention, the signals amplified by the read amplifiers are rewritten into the memory cells via the first bit lines, simultaneously with a transfer of the potentials into the reference cells via the second bit lines.

Other features which are considered as characteristic for the invention are set forth in the appended claims.

Although the invention is illustrated and described herein as embodied in Integrated memory having memory cells and reference cells, and operating method for such a memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Although in the following text, the invention will be explained using exemplary embodiments which relate to a ferroelectric memory of the FRAM type, the invention is not restricted to such memories. It is suitable for use in all integrated memories which have differential read amplifiers and pairs of bit lines which are connected to the latter and to which, in addition to the normal memory cells, reference cells are also connected. For example, the invention is also suitable for use in the case of DRAMs.

Figure 1:
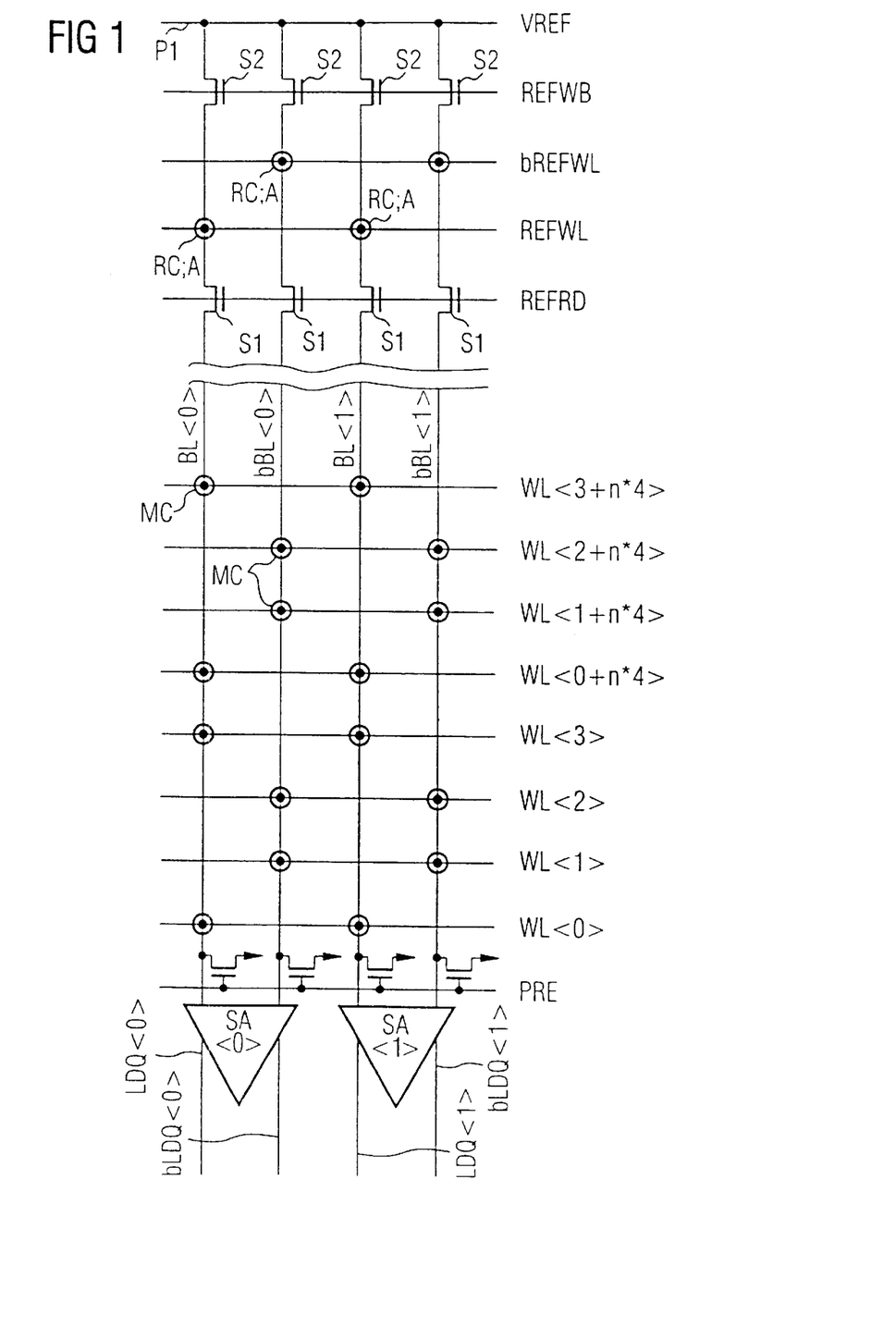
FIG. 1 is a diagrammatic view of a first exemplary embodiment of the integrated memory according to the invention.

Referring now to the figures of the drawing in detail and first, particularly, to FIG. 1 thereof, there is shown a detail from a memory cell array belonging to an integrated memory of the FRAM type. Two pairs of bit lines BLi, bBLi are shown, which are each connected to a differential read amplifier SAi. The read amplifiers SAi amplify voltages which are present on the respective pair of bit lines during a read access and forward these voltages in amplified form to pairs of data lines LDQi, bLDQi. During a write access, they transfer a voltage from the pair of data lines to the respective pair of bit lines. Although only two pairs of bit lines BLi, bBLi are shown in FIG. 1, the memory has a large number of pairs of bit lines with corresponding read amplifiers SAi. Although in the exemplary embodiments outlined here the "folded bit line concept" is represented, in which the two bit lines of each pair of bit lines run parallel to each other, the invention can equally well be used on memories constructed in accordance with the "open bit line concept", in which the two bit lines of a pair of bit lines are arranged on different sides of the associated read amplifier.

Normal memory cells MC are arranged at the crossing points of the bit lines with word lines WLi. In addition, there is a precharge line PRE, which is connected to gates of transistors via which each of the bit lines BLi, bBLi is connected to a precharge potential. The memory also has reference cells RC, which are arranged at crossing points of the bit lines BLi, bBLi and reference word lines REFWL, bREFWL. The reference cells RC are connected to the bit lines at circuit nodes A.

Figure 5:
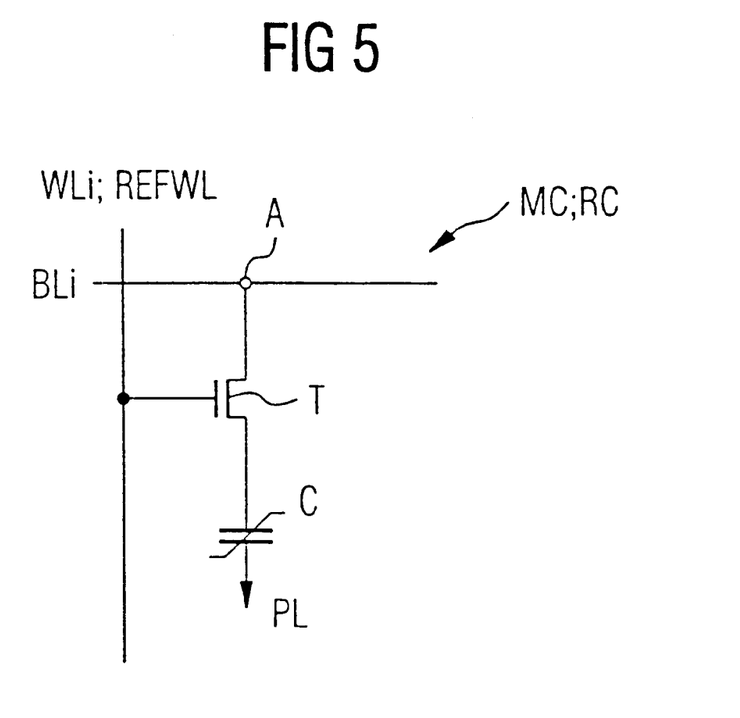
FIG. 5 is a schematic diagram of the construction of a memory cell and a reference cell in the different exemplary embodiments.

The memory cells MC and the reference cells RC are constructed identically. FIG. 5 shows their structure. They each have a selection transistor T and a storage capacitor C with a ferroelectric dielectric. One electrode of the storage capacitor C is connected to a plate potential PL, and the other electrode is connected via the selection transistor T to the corresponding bit line BLi. The gate of the selection transistor T is connected to one of the word lines WLi and, respectively, one of the reference word lines REFWL. For the reference cells RC, the circuit node A, to which the reference cell is connected by means of the associated bit line BLi, is also shown in FIG. 5.

It can be gathered from FIG. 1 that the bit lines BLi, bBLi of this exemplary embodiment are subdivided into two areas, specifically a first area in which they are connected to the memory cells MC, and a second area in which they are connected to the reference cells RC. The two areas of the bit lines are connected to one another via first switching elements S1. In addition, a first potential line P1 is connected to the end of the bit lines BLi, bBLi via second switching elements S2. The first S1 and the second S2 switching elements are n-channel transistors in the exemplary embodiments considered here. The gates of the first four switching elements S1 are connected to a reference read line REFRD, and the gates of the second switching elements S2 are connected to a reference write line REFWB.

A read access to the memory illustrated in FIG. 1 will be described below. Firstly, via the precharge line, it is ensured that all the bit lines BLi, bBLi are precharged to the precharge potential. Then, the transistors connected to the precharge potential are turned off. One of the word lines WLi is then brought to a high potential, while the remaining word lines remain at low potential. By this, the two memory cells MC connected to the activated word line WLi are selected, by their storage capacitors C being electrically conductively connected to the associated bit line via their selection transistor T. At the same time as one of the word lines WLi is activated, that one of the reference word lines REFWL, bREFWL that is associated with the reference cells RC which are not connected to the same bit lines as the memory cells MC just to be read from, is brought to a high level. For example, the word line WL0 and the reference word line bREFWL are activated at the same time. In addition, at this time, the reference read line REFRD is at a high level and the reference write line REFWB is at a low level. Thus, each memory cell MC to be read out is connected to one input of the associated read amplifier SAi and the corresponding reference cell RC is connected to the other input of this read amplifier. Depending on the item of data stored in the memory cell MC and, respectively, the reference information stored in the reference cell, the potential of the bit line BLi and, respectively, bBLi connected to these is influenced differently. The read amplifier SAi then amplifies the potential difference which is then established across its inputs.

Since the above-described memory cells MC and reference cell RC are those whose memory content is destroyed during a read access, it is necessary, at the end of the read access, to write back the information previously read out into the cells again. Since it is desired, firstly, always to write the same reference information into the reference cells RC, but, secondly (depending on the item of data to be stored), sometimes a logic "1" and sometimes a logic "0" has to be written into the memory cells MC, for the purpose of rewriting in this exemplary embodiment the reference read line REFRD is brought to a low potential, so that the first switching elements S1 turn off again. The reference cells RC are therefore uncoupled from the read amplifiers SAi. However, rewriting the item of data read from the memory cell MC is carried out—as conventional in FRAMs or else DRAMs—by means of the read amplifier SAi, in that the information amplified by the latter is simply stored in the memory cell MC. On the other hand, the reference information is rewritten into the reference cells MC by turning on the second switching elements S2 via the reference write line REFWB. On the first potential line P1 there is an appropriate reference potential VRef which, via the respective second switching element S2, is written into the reference cells RC which are still selected via the reference word line bREFWL. The read access is then completed.

A write access is carried out in a manner known per se, by the appropriate memory cells MC being selected via their word lines WLi, and the desired item of data being transferred from the pair of data lines LDQi, bLDQi, via the read amplifier SAi, to the pair of bit lines BLi, bBLi. In this case, the first switching elements S1 can remain switched off, and there is no selection of one of the reference word lines REFWL, bREFWL.

In the exemplary embodiment presented here, the first S1 and the second S2 switching elements and also the reference cells RC are arranged in the same grid as the memory cells MC. This results in a compact memory architecture which is simple to produce.

Figure 2:
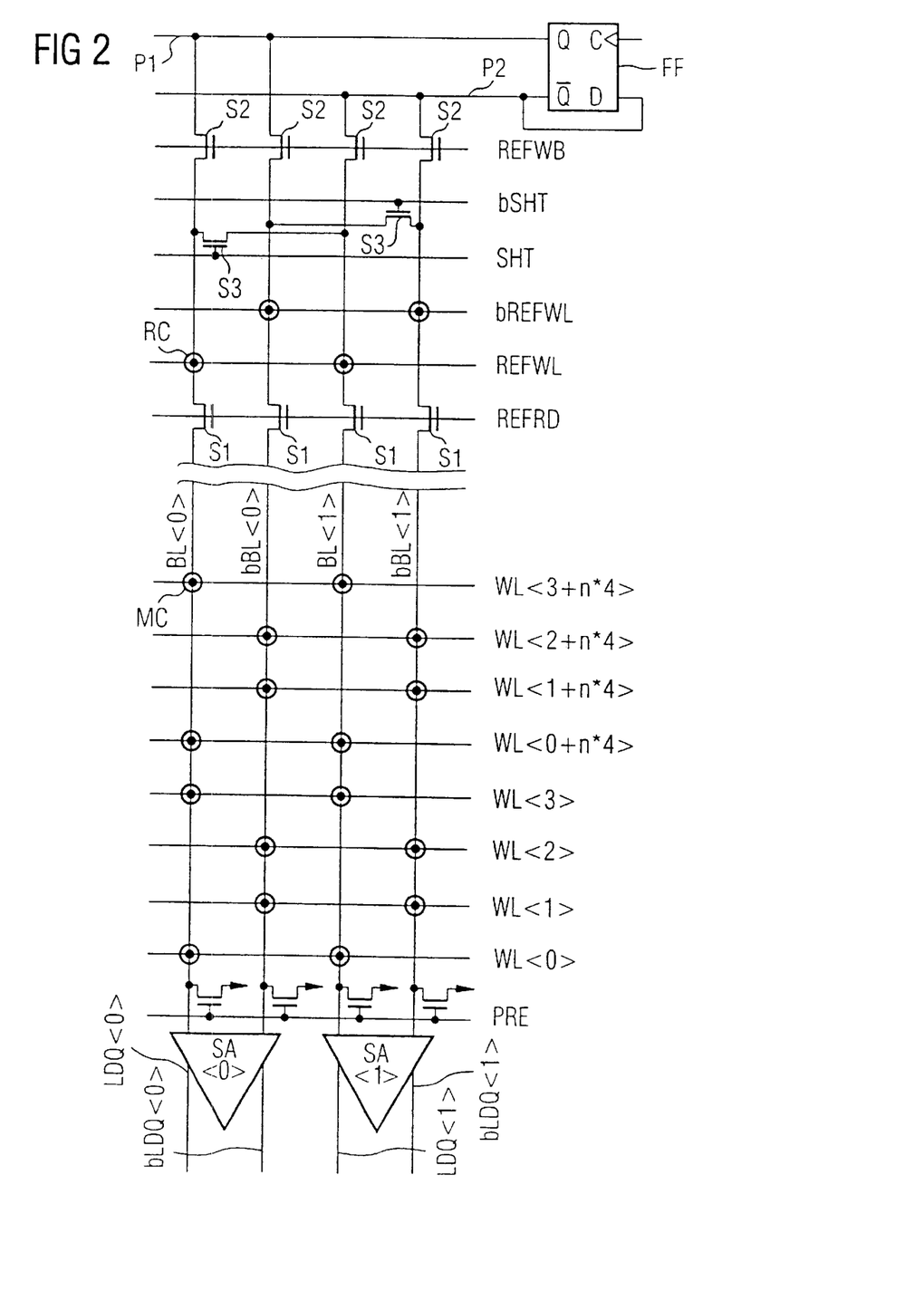
FIG. 2 is a similar view of a variant of the integrated memory illustrated in FIG. 1.

FIG. 2 shows a modification of the exemplary embodiment illustrated in FIG. 1. In the exemplary embodiments explained below by using FIGS. 2 to 4, components already explained in FIG. 1 and their function are discussed only if there are differences. The memory shown in FIG. 2 additionally has third switching elements S3 in the form of n-channel transistors. One third switching element S3 connects the bit lines BL0 and BL1 to each other, and the other switching element S3 connects the bit lines bBL0 and bBL1. The gates of the third switching elements S3 are each connected to a control line SHT, bSHT. The third switching elements S3 are arranged in the second area of the bit lines BLi, bBLi, which is located between the first S1 and second S2 switching elements. A further difference from the exemplary embodiment in FIG. 1 is that only the first pair of bit lines BL0, bBL0 is connected to the first potential line P1 via the second switching elements S2, while the second pair of bit lines BL1, bBL1 is connected to a second potential line P2 via its second switching elements.

The two potential lines P1, P2 are each connected to an output of a change flip-flop FF, so that they have opposite potentials. The third switching elements S3 and the two potential lines P1, P2 serve to generate the reference potential needed in the case of a read access to one of the memory cells MC. When the reference information is written into the reference cells RC via the second switching elements S2, an item of reference information which is the inverse of that which is written into the reference cells RC of the second pair of bit lines BL1, bBL1 is written into the reference cells RC of the first pair of bit lines BL0, bBL0. The flip-flop FF is used to generate these two inverse items of reference information on the potential lines P1, P2. Via a clock input C to the flip-flop FF, a change in the polarity of its output signals is effected at regular time intervals. This prevents the same logic state always being written into the reference cells RC, which would lead to fatigue of the corresponding reference cell RC or the ferroelectric dielectric of its storage capacitor C. By using the flip-flop FF, it is possible to write different logic states into the reference cells RC of two pairs of bit lines in each case, alternating with the cycling of the flip-flop FF at longer time intervals. The inverse reference information can also be supplied in a different way, instead of with a flip-flop, in other exemplary embodiments. In particular, it can be supplied statically, without its polarity changing.

If, in the case of the memory according to FIG. 2, the word line WL0 and the reference word line bREFWL are again activated during a read access, for example, the two activated reference cells RC, because of their opposing logic level, generate a potential which is different in each case on the corresponding bit lines bBLi, with which they are conductively connected via the first switching elements S1. Then, via the control line bSHT associated with these two bit lines, the corresponding third switching element S3 is turned on. The third switching element S3 associated with the two other bit lines BLi, on the other hand, remains turned off. The conductive third switching element S3 short-circuits the two bit lines bBLi connected to it. This results in a potential equalization between these two bit lines, as a result of which the desired reference potential is generated. The two read amplifiers SAi are then activated, and each amplify the potential difference between the reference potential and the potential established on the bit line BLi electrically connected to the respectively activated memory cell MC.

Figure 3:
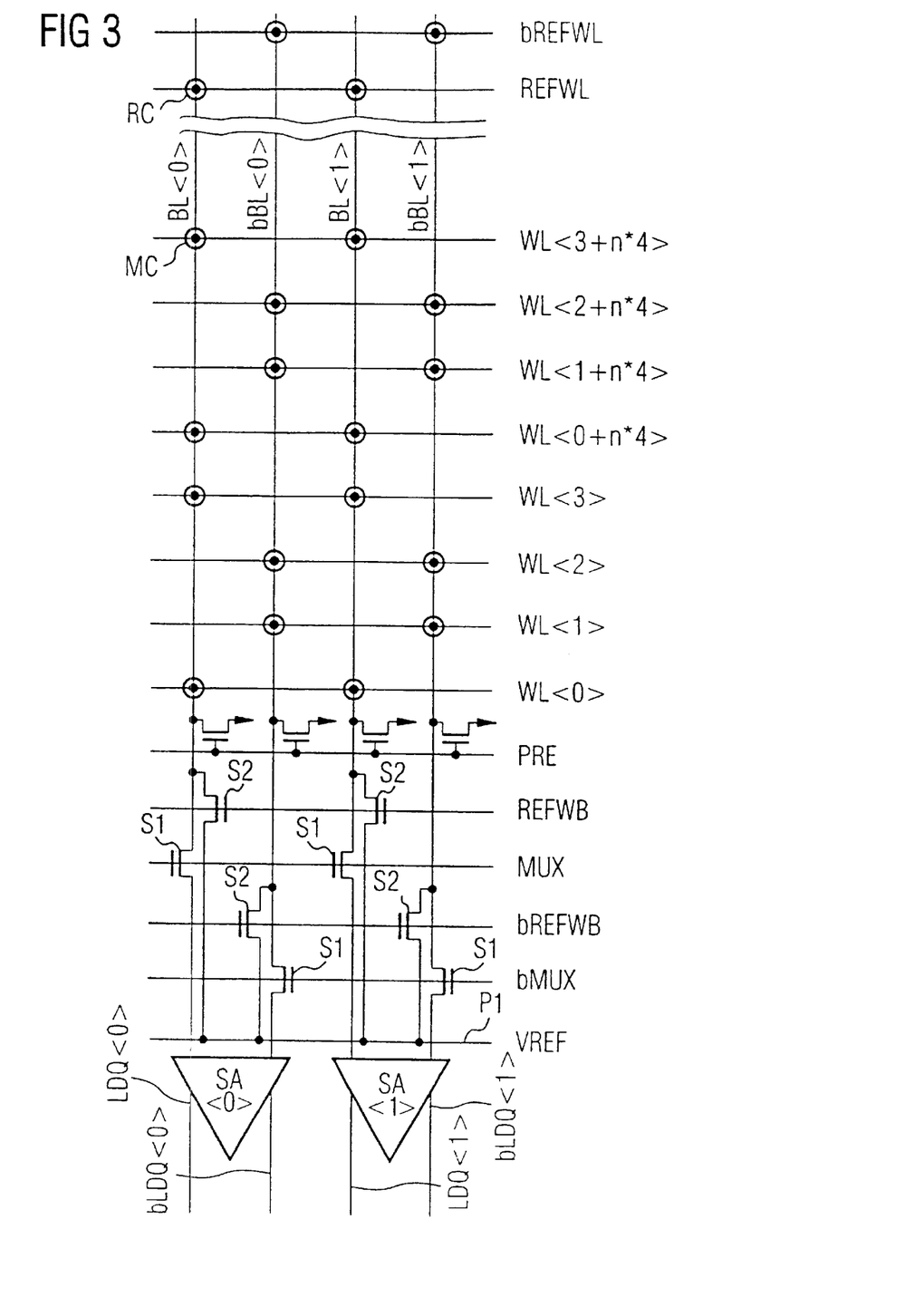
FIG. 3 is a similar view of a further exemplary embodiment of the integrated memory.
Figure 4:
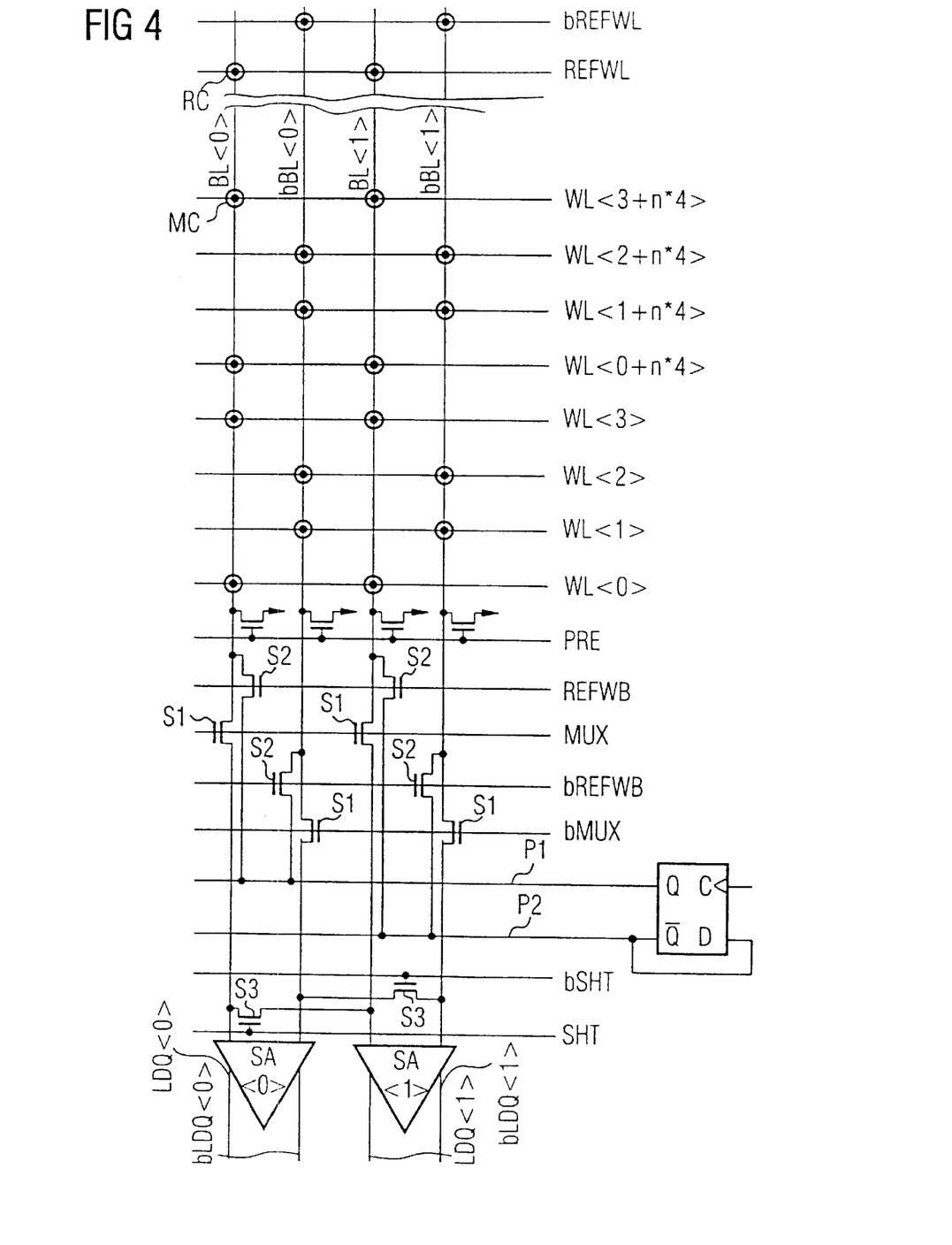
FIG. 4 is a similar view of a variant of the exemplary embodiment illustrated in FIG. 3.

The rewriting at the end of the read access in the case of the memory according to FIG. 2 takes place in a similar way to that from FIG. 1. However, the third switching element S3 is previously turned off again via the control line bSHT. During the rewriting of the reference information into the reference cells RC, the first switching elements S1 are then turned off and the second switching elements S2 are turned on. FIGS. 3 and 4 show exemplary embodiments of the integrated memory in which the first switching elements S1, the second switching elements S2 and the potential lines P1, P2 are arranged at that end of the bit lines BLi, bBLi facing the read amplifiers SAi. Both in FIG. 3 and in FIG. 4, the bit lines BLi, bBLi are therefore connected to the read amplifiers SAi via the first switching elements S1. In this way, a coherent memory cell array of the memory cells MC with the reference cells RC is made possible, since the first switching elements S1 now no longer subdivide the bit lines into areas which are either connected to the memory cells or to the reference cells. Since, as a rule, there is sufficient space available in the vicinity of the read amplifiers SAi, the implementation according to FIGS. 3 and 4 is under certain circumstances possible with fewer difficulties than that according to FIGS. 1 and 2, even if the memory is produced with very small structure sizes. Sufficient space in the vicinity of the read amplifiers SAi is available in particular when the latter are connected to a plurality of pairs of bit lines in each case via corresponding multiplexers (not illustrated).

The memory according to FIG. 3 differs from that in FIG. 1 and the memory in FIG. 4 differs from that in FIG. 2 additionally in the fact that the first switching elements S1 connected to the bit lines BL0 and BL1 are connected to a first select line MUX, and the two other first switching elements S1 are connected to a second select line bMUX. A further difference is that the second switching elements S2 connected to the bit lines BL0 and BL1 are connected at their gates to a first reference write line REFWB, and the second switching elements S2 connected to the bit lines bBL0 and bBL1 are connected at their gates to a second reference write line bREFWB.

A read access to the memory in FIG. 3 is again carried out, for example, by activating the word line WL0 and the reference word line bREFWL. In addition, the first select line MUX and the second select line bMUX are brought to a high level, while the two reference write lines REFWB, bREFWB have a low potential. All the first switching elements S1 are then turned on and all the second switching elements S2 are turned off. After the difference signal which is established has been amplified by the read amplifiers SAi, the action of rewriting into the memory cells MC and the reference cells RC is carried out by the reference cells RC being uncoupled from the read amplifiers, by the corresponding first switching elements S1 turning off. This is carried out by the second select line bMUX assuming a low level, while the first select line MUX maintains a high level. Then, the second reference write line bREFWB assumes a high level, so that the second switching elements S2 connected to the latter turn on. The first reference write line REFWB remains at a low level. Then, since the word line WL0 and the reference word line bREFWL continue to be activated, the information amplified by the read amplifier SAi is rewritten into the memory cells MC via the first switching elements S1 connected to the bit lines BLi and, at the same time, the desired reference information is transferred from the first potential line P1 into the two selected reference cells RC via the second switching elements S2 connected to the bit lines bBLi.

The memory illustrated in FIG. 4 in turn generates the reference potential needed at the read amplifier SAi in the manner already described with reference to FIG. 2, by reading out two reference cells RC, in which mutually inverse items of information have been stored, and subsequently short-circuiting them via the corresponding third switching element S3. Since the third switching elements S3 in FIG. 4 are arranged directly on the read amplifier SAi, in order to short-circuit the reference information read out from the reference cells RC, it is necessary for the first switching elements S1 to have been switched on previously. The third switching elements S3, however, can also be arranged on that side of the first switching elements S1 which faces away from the read amplifiers SAi, so that the first switching elements S1 only have to be switched on when the short circuit has already been made via the corresponding third switching element S3. The first and second switching elements S1, S2 in FIG. 4 are driven in an equivalent manner to that in FIG. 3.

In the exemplary embodiments according to FIG. 2 and FIG. 4, it is important that after the two bit lines carrying the reference information have been short-circuited by the corresponding third switching element S3, the latter is turned off again before the read amplifiers SAi are activated and amplify the established potential difference. Otherwise, when mutually inverse items of information are read out from the two memory cells MC to be read out at the same time, a short circuit occurs between the two read amplifiers SAi, which are then driving inverse levels.

In the case of the exemplary embodiments outlined here, in each case the rewriting of the data read out from the memory cells MC via the read amplifiers SAi and the rewriting of the reference information read out from the reference cells RC in each case takes place simultaneously via the corresponding potential lines P1, P2. In addition, in all the exemplary embodiments, the reading out of the data from the memory cells MC and of the reference information from the reference cells RC, and also the short-circuiting of the bit line connected to the reference cells RC via the third switching elements S3, in each case takes place simultaneously.

The exemplary embodiments according to FIG. 1 and FIG. 2 have the further advantage that, when rewriting the reference information into the reference cells RC, it is not the entire capacitance of the bit lines BLi, bBLi that is connected to the respective potential line P1, P2, but only the very short area of the bit lines which is connected to the reference cells RC. By this means, the reference information can be rewritten via the second switching elements S2 with low losses and in a very short time.

We claim:

1. An integrated memory, comprising:

a first pair of bit lines;

a plurality of word lines and reference word lines;

memory cells respectively arranged at crossing points of said word lines with a bit line of said first pair of bit lines and each having a selection switching element for connecting said memory cell with a respective said bit line and said selection switching element having a control connection connected to a respective said word line;

a first differential read amplifier connected to said bit lines of said first pair of bit lines and a second differential read amplifier;

two reference cells respectively arranged at a crossing point of one of said bit lines and a reference word line, having a structure substantially corresponding to a structure of said memory cells, and having a selection switching element for connecting said reference cells via a circuit node to a respective said bit line, and said selection switching element having a control connection connected to the respective said reference word line;

first switching elements connecting said circuit nodes to said read amplifier;

a first potential line for supplying a first potential to be stored in said reference cells;

second switching elements connecting said circuit nodes to said first potential line;

a second pair of bit lines connected to said second differential read amplifier and, in correspondence with said first pair of bit lines, having memory cells, reference cells, and first and second switching elements;

two third switching elements each connecting a respective one of said bit lines of said first pair of bit lines to a bit line of said second pair of bit lines; and a second potential line connected to said circuit nodes of said bit lines of said second bit line pair via corresponding said second switching elements, said second potential line supplying a second potential to be stored in said reference cells of said second pair of bit lines.

2. The integrated memory according to claim 1, wherein said reference cells are arranged at one end of the respective said bit line opposite from said read amplifier, and said first switching elements are arranged between the circuit nodes and an area of the respective bit line connected to said selection switching elements of the associated said memory cells.

3. The integrated circuit according to claim 2, wherein said second switching elements and said first potential line are disposed at the one end of the respective said bit line facing away from the read amplifier.

4. The integrated memory according to claim 1, wherein said first switching elements connect an end of the respective said bit line facing said read amplifier to said read amplifier.

5. The integrated circuit according to claim 4, wherein said second switching elements and said first potential line are disposed at the end of the respective said bit line facing said read amplifier.

6. The integrated memory according to claim 4, wherein, during a read access to a given one of said memory cells of one of said bit lines, said selection switching element of said given memory cell and said selection switching element of said reference cell of the other bit line are turned on and also both first switching elements are turned on and both second switching elements are turned off, and wherein, during a rewriting operation, carried out during the read access, of the information previously read out from the corresponding said memory cell by the read amplifier said selection switching elements of said given memory cell and of said reference cell are turned on and only said first switching element connected to said one bit line and said second switching element connected to the other bit line are turned on.

7. The integrated memory according to claim 1, which further comprises a control unit connected to said first and second potential lines, for generating said first and second potentials with respectively alternating levels.

8. A method of operating an integrated memory, which comprises the following steps:

reading out information from two memory cells and transferring the information via two first bit lines to first inputs of two differential read amplifiers;

reading out reference information from reference cells and transferring the reference information via second bit lines to second inputs of the read amplifiers;

amplifying voltages present at the inputs of the read amplifiers with the read amplifiers;

disconnecting the reference cells from the read amplifiers;

connecting the reference cells to potential lines; and transferring potentials from the potential lines via the second bit lines to the reference cells.

9. The method according to claim 8, wherein the potentials of the potential lines are different, and the method comprises connecting the second bit lines to each other for setting a reference potential.

10. The method according to claim 8, which further comprises rewriting the signals amplified by the read amplifiers into the memory cells via the first bit lines, simultaneously with a transfer of the potentials into the reference cells via the second bit lines.

* * * * *